US010242878B2

(12) United States Patent
Urano et al.

(10) Patent No.: US 10,242,878 B2
(45) Date of Patent: Mar. 26, 2019

(54) SUBSTRATE PROCESSING METHOD AND RECORDING MEDIUM

(71) Applicant: TOKYO ELECTRON LIMITED, Tokyo (JP)

(72) Inventors: Tomonari Urano, Yamanashi (JP); Kyohei Noguchi, Yamanashi (JP); Osamu Yokoyama, Yamanashi (JP); Takashi Kobayashi, Yamanashi (JP); Satoshi Wakabayashi, Yamanashi (JP); Takashi Sakuma, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/443,687

(22) Filed: Feb. 27, 2017

(65) Prior Publication Data
US 2017/0250086 A1     Aug. 31, 2017

(30) Foreign Application Priority Data

Feb. 26, 2016   (JP) ................................. 2016-036013

(51) Int. Cl.
| H01L 21/44 | (2006.01) |
| H01L 21/285 | (2006.01) |
| H01L 21/67 | (2006.01) |
| H01L 21/673 | (2006.01) |

(52) U.S. Cl.
CPC .. H01L 21/28556 (2013.01); H01L 21/67196 (2013.01); H01L 21/67201 (2013.01); H01L 21/67393 (2013.01)

(58) Field of Classification Search
CPC ......... H01L 21/28556; H01L 21/67196; H01L 21/67201; H01L 21/67393
See application file for complete search history.

(56) References Cited

U.S. PATENT DOCUMENTS

| 5,981,388 A * | 11/1999 | Miyamoto .............. C23C 16/14 257/E21.17 |
| 2001/0001954 A1 * | 5/2001 | Urabe ................. C23C 16/4581 118/728 |

(Continued)

FOREIGN PATENT DOCUMENTS

| JP | 2004-083983 | 3/2004 |
| JP | 2004-232080 | 8/2004 |

*Primary Examiner* — Victor A Mandala
*Assistant Examiner* — Colleen E Snow

(57) ABSTRACT

A substrate processing method is for forming a metal film on a target substrate by using a plasma. The method includes loading a target substrate having a silicon-containing layer on a surface thereof into a processing chamber which is pre-coated by a film containing a metal, introducing hydrogen gas and a gaseous compound of the metal and halogen into the processing chamber, generating a plasma, and forming a metal film on the target substrate. The method further includes performing a first reduction process of forming an atmosphere of a plasma obtained by activating hydrogen gas in the processing chamber, unloading the target substrate from the processing chamber, performing a second reduction process of forming an atmosphere of a plasma obtained by activating hydrogen gas in the processing chamber, and loading a next target substrate into the processing chamber.

8 Claims, 12 Drawing Sheets

(56) References Cited

U.S. PATENT DOCUMENTS

| | | | |
|---|---|---|---|
| 2005/0054213 A1* | 3/2005 | Derderian | C23C 16/0272 |
| | | | 438/778 |
| 2005/0233093 A1 | 10/2005 | Tada et al. | |
| 2006/0068104 A1* | 3/2006 | Ishizaka | C23C 16/34 |
| | | | 427/248.1 |
| 2007/0257372 A1* | 11/2007 | Tada | C23C 16/0281 |
| | | | 257/763 |
| 2009/0321936 A1* | 12/2009 | Kojima | H01L 21/28556 |
| | | | 257/751 |
| 2014/0206189 A1* | 7/2014 | Yamasaki | C23C 16/34 |
| | | | 438/680 |

\* cited by examiner (TEST EXAMPLE 1)

(TEST EXAMPLE 2)

(COMPARATIVE EXAMPLE)

SUBSTRATE PROCESSING METHOD AND RECORDING MEDIUM

CROSS-REFERENCE TO RELATED APPLICATION

This application claims priority to Japanese Patent Application No. 2016-036013 filed on Feb. 26, 2016, the entire contents of which are incorporated herein by reference.

FIELD OF THE INVENTION

The disclosure relates to a technique of forming a metal film on a target substrate under a vacuum atmosphere in a processing chamber.

BACKGROUND OF THE INVENTION

As semiconductor devices are miniaturized, a contact portion of a transistor is miniaturized and, also, a gate structure is shifted from a planar type to a multi-gate fin structure that is a three-dimensional structure. In the contact portion, a Ti (titanium) film is formed on a Si (silicon) layer or a SiGe (silicon germanium) layer as a base, and silicide is formed by reaction between Si and Ti. As for a method for forming a Ti film, there has been developed a method for forming a contact portion by using CVD (Chemical Vapor Deposition) that ensures a better step coverage compared to sputter film formation.

The Ti film formation using CVD is performed by loading a substrate into a processing chamber and converting a gaseous mixture of $TiCl_4$ (titanium tetrachloride) gas and $H_2$ (hydrogen) gas into a plasma. At this time, Cl (chlorine) contained in $TiCl_4$ are taken as an impurity into the Ti film and remains as an impurity in the Ti film formed on the substrate. Since the Ti film containing high concentration of Cl is unstable, the Ti film deposited in the processing chamber is peeled off and particles are generated. After the Ti film formation, $Ti_xCl_x$ or $Cl_x$ remains in a vacuum atmosphere in the processing chamber. Thus, the surface of the Ti film formed on the substrate is etched and becomes rough. Accordingly, $Ti_xCl_x$ is adhered onto a backside of the substrate, which results in contamination of the substrate.

Therefore, after the film is formed on the substrate, post treatment is performed to stabilize the film by reducing and removing Cl in the Ti film by supplying $NH_3$ (ammonia) gas into the processing chamber in which the substrate is provided and forming a TiN (titanium nitride) film by nitriding a surface of the Ti film.

When substrates are exchanged, the film is stabilized by removing Cl remaining in an atmosphere in the processing chamber in which no substrate is provided by using a plasma of the above-described gaseous mixture and forming a TiN film on the surface of the Ti film covering the inner surfaces of the processing chamber.

Between a process of cleaning an inside of the processing chamber and a process of forming a film on the substrate, pre-coating for forming a thin film in advance on an inner wall of the processing chamber, a surface of a mounting table, and a surface of a gas shower head for supplying a processing gas is performed. In a conventional case, the pre-coating film is stabilized by nitriding the surface of the Ti film by supplying $NH_3$ gas into the processing chamber or generating an $NH_3$ plasma.

However, as the Ti film becomes thinner due to the miniaturization of devices, the surface of the Ti film is nitrided by N (nitrogen) taken into the Ti film by supplying $NH_3$ gas into the processing chamber in which the substrate is provided, and silicidation in an interface between the Ti film and the Si film is disturbed. Further, the pre-coating film is a TiN film, and the Ti film that has been formed on the inner wall of the processing chamber or on the surface of the gas shower head during the film formation on the substrate is nitrided to a TiN film during the exchange of substrates. Therefore, the TiN film is sputtered by a plasma generated during the film formation on the substrate, specifically by $Ar^+$ ions, and N is taken into the film formed on the substrate, which also disturbs the silicidation. As a result, if the miniaturization of devices progresses further, it is difficult to form a contact having a low resistance.

Japanese Patent Application Publication No. 2004-83983 discloses a technique for cleaning by introducing chlorine gas into a chamber in which a Ti film formation by plasma CVD is performed and decomposing a nickel chloride generated due to reaction between the chlorine gas and a nickel member in the chamber by hydrogen active spices. However, the components disclosed in the above-cited reference are different from those of the present disclosure.

Japanese Patent Application Publication No. 2004-232080 discloses a technique for intermittently supplying $TiCl_4$ gas in a state where $H_2$ gas is supplied into a chamber in which a Ti film formation by plasma CVD is performed. This technique has a purpose of realizing a low-temperature process while removing Cl in the film, which is different from the purpose of the present disclosure, and the method thereof is also different from that of the present disclosure.

SUMMARY OF THE INVENTION

In view of the above, the disclosure provides a technique capable of preventing N from being taken into a metal film when the metal film is formed on a substrate by using a plasma.

In accordance with an aspect of the present disclosure, there is provided a substrate processing method for forming a metal film on a target substrate by using a plasma, including: loading a target substrate having a silicon-containing layer on a surface thereof into a processing chamber which is pre-coated by a film containing a metal, introducing hydrogen gas and a gaseous compound of the metal and halogen into the processing chamber, generating a plasma, and forming a metal film on the target substrate; performing a first reduction process of forming an atmosphere of a plasma obtained by activating hydrogen gas in the processing chamber; unloading the target substrate from the processing chamber; performing a second reduction process of forming an atmosphere of a plasma obtained by activating hydrogen gas in the processing chamber; and loading a next target substrate into the processing chamber.

In the present disclosure, when a film is formed by generating a plasma while supplying a compound of a metal and halogen and a hydrogen gas, an atmosphere of a plasma obtained by activating the hydrogen gas is generated in each of the processing chamber where the target substrate is loaded after the film formation and in the processing chamber where the target substrate is unloaded. Therefore, the halogen can be removed from the target substrate and an atmosphere in the processing chamber, and N can be prevented from being taken into a metal film of the target substrate because a reduction process as post treatment is performed without using ammonia.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
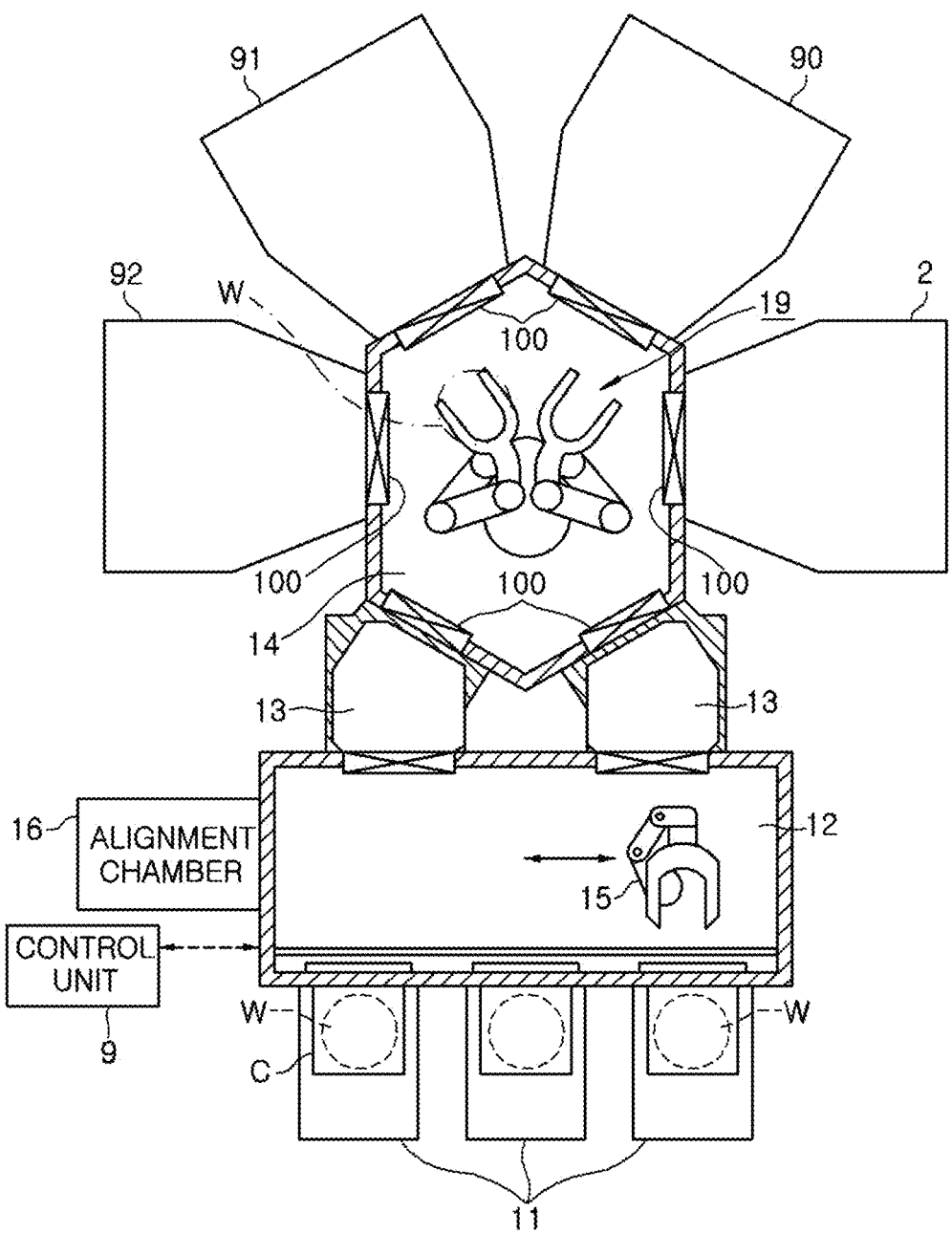
FIG. 1 is a top view of a multi-chamber system according to an embodiment.

A substrate processing method according to an embodiment of the present disclosure is performed by a multi-chamber system shown in FIG. 1. A semiconductor wafer (hereinafter, referred to as "wafer") W as a target substrate is unloaded from a transfer carrier C on a load port 11 by a transfer arm 15 and transferred in the order of an alignment chamber 16, a normal pressure transfer chamber 12, and a load-lock chamber 13. Then, the wafer W is unloaded from the load-lock chamber 13 by a transfer arm 19 in a vacuum transfer chamber 14 and transferred to a COR (Chemical Oxide Removal) processing apparatus 90 that is a processing module.

The COR processing apparatus 90 is configured to supply to the wafer HF gas and $NH_3$ gas as reactant gases and Ar gas and $N_2$ gas as dilution gases. Accordingly, a native oxide layer ($SiO_2$ layer) formed on a Si film on a surface of the wafer W reacts with the HF gas and the $NH_3$ gas. As a consequence, reaction by-products such as $(NH_4)_2SiF_6$ (ammonium fluorosilicate), water and the like are generated. Next, the wafer W is transferred to an annealing apparatus 91 and heated to, e.g., 175° C. Therefore, the reaction by-products such as $(NH_4)_2SiF_6$, water and the like generated in the COR processing apparatus 90 are sublimated and removed. Thereafter, the wafer W is processed in a plasma processing apparatus 2 as will be described later. For example, a Ti film is formed by plasma CVD (Chemical Vapor Deposition) on the wafer W having thereon the Si film and, then, a TiN film is formed on the surface of the Ti film by a thermal ALD (Atomic layer Deposition) apparatus 92. A reference numeral 100 in FIG. 1 denotes gate valves.

The multi-chamber system includes a control unit 9, e.g., a computer. The control unit 9 includes a data processing unit having a program, a memory, a CPU, and the like. The program includes a program related to transfer operations in the multi-chamber system and recipes (programs) for performing process recipes in the respective processing modules such as the COR processing apparatus 90, the annealing apparatus 91, the plasma processing apparatus 2, and the thermal ALD apparatus 92, pre-treatment, post-treatment and the like. The program is stored in a storage unit of a computer storage medium, e.g., a flexible disk, a compact disk, a hard disk, an MO (magneto-optical disk) or the like, and installed in the control unit 9.

Figure 2:
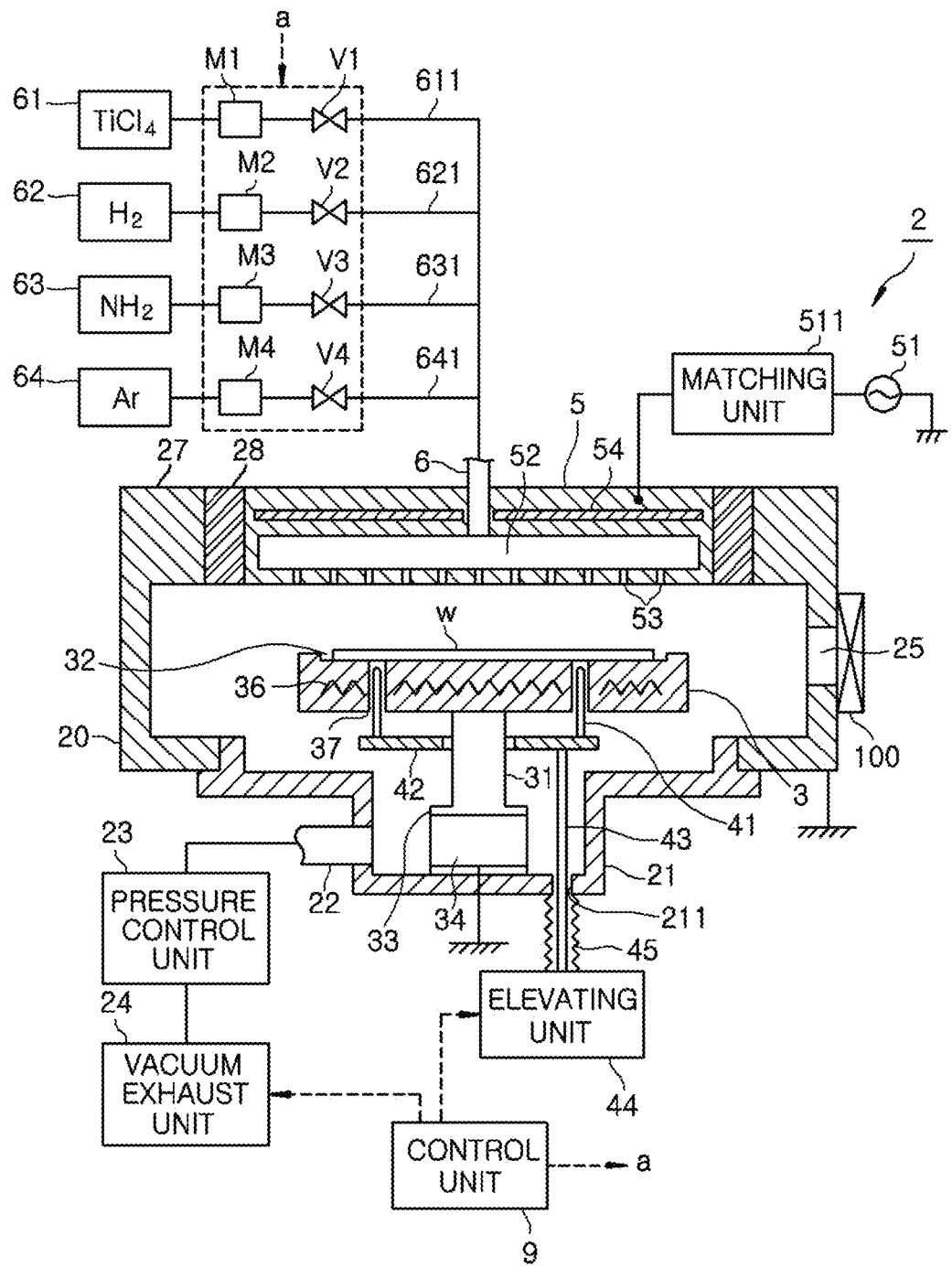
FIG. 2 is a vertical cross sectional view of a plasma processing apparatus for forming a Ti film on a wafer.

Next, the plasma processing apparatus 2 will be described with reference to FIG. 2. The plasma processing apparatus 2 includes a substantially cylindrical processing chamber 20 made of a metal and grounded to earth. A cylindrical gas exhaust chamber 21 projecting downward is formed at a central portion of a bottom surface of the processing chamber 20. A gas exhaust line 22 is connected to a side surface of the gas exhaust chamber 21. A vacuum exhaust unit 24 including a vacuum pump or the like is connected to the gas exhaust line 22 via a pressure control unit 23 including a pressure control valve, e.g., a butterfly valve, and the like. Accordingly, a pressure in the processing chamber 20 can be reduced to a predetermined vacuum level. In addition, a transfer port 25 for transferring the wafer W to and from a transfer chamber (not shown) is formed at a side surface of the processing chamber 20. The transfer port 25 can be opened/closed by a gate valve 100.

A mounting table 3 made of, e.g., nickel (Ni), is provided in the processing chamber 20 to support the wafer W in a substantially horizontal plane. A support member 31 made of a metal is connected to a central portion of a bottom surface of the mounting table 3. A flange 33 is formed at a lower end of the support member 31. The flange 33 is fixed to a bottom surface of the gas exhaust chamber 21 through a spacer 34 for securing an earth interval.

A heater 36 is provided in the mounting table 3 and configured to heat the wafer W to a set temperature, e.g., about 450° C., by power supplied from a power supply unit (not shown) based on a control signal from the control unit 9. A pocket 32 that is a recess for supporting the wafer W is formed on a top surface of the mounting table 3. The wafer W is mounted in the pocket 32. Three holes 37 are extended through the mounting table 3 and arranged along a circumferential direction. Three elevating pins 41 constituting an elevation member for holding and vertically moving the wafer W on the mounting table 3 are inserted in the respective holes 37. The elevating pins 41 are made of ceramic, e.g., alumina or the like, or quartz. The elevating pins 41 are connected to an elevating unit 44 including, e.g., an air cylinder, provided at the outside of the processing chamber 20 through a support body 42 and an elevating shaft 43. The elevating unit 44 is installed below the gas exhaust chamber 21. A bellows 45 is provided between the elevating unit 44 and an opening 211 of the elevating shaft 43 which is formed at a bottom surface of the gas exhaust chamber 21.

A gas shower head 5 made of Ni and serving as an upper electrode is provided at a ceiling portion of the processing chamber 20 through an insulating member 28. A high frequency power supply 51 for supplying a high frequency power of, e.g., 300 W to 2500 W, is connected to the gas shower head 5 via a matching unit 511. Therefore, the plasma processing apparatus 2 of the present embodiment is configured as a parallel plate type plasma processing apparatus in which a plasma is generated by supplying a gas to be excited into the processing chamber 20 and applying a high frequency power between the gas shower head 5 serving as the upper electrode and the mounting table 3 serving as a lower electrode.

A gas supply chamber 52 is formed in the gas shower head 5. A plurality of holes 53 for distributing a processing gas into the processing chamber 20 is uniformly formed in a bottom surface of the gas supply chamber 52. A heating unit 54 is provided in the gas shower head 5, e.g., above the gas supply chamber 52. The wafer W is heated to a set temperature by power supplied from a power supply unit (not shown) to the heating unit 54 based on a control signal from the control unit 9 to be described later.

A downstream end portion of the gas supply line 6 is connected to the gas supply chamber 52. An upstream side of the gas supply line 6 joins with a $TiCl_4$ gas supply line 611 serving as a supply channel for supplying a raw material gas containing $TiCl_4$, an $H_2$ gas supply line 621 for supplying a reduction gas, an $NH_3$ gas supply line 631 for supplying $NH_3$ gas for nitriding, and an Ar gas supply line 641. A $TiCl_4$ gas supply source 61 is connected to an upstream end portion of the $TiCl_4$ gas supply line 611, and a flow rate controller M1 and a valve V1 are provided in the $TiCl_4$ gas supply line 611 from the upstream side. An $H_2$ gas supply source 62 is connected to an upstream end portion of the $H_2$ gas supply line 621, and a flow rate controller M2 and a valve V2 are provided in the $H_2$ gas supply line 621 from the upstream side. An $NH_3$ gas supply source 63 is connected to an upstream end portion of the $NH_3$ gas supply line 631, and a flow rate controller M3 and a valve V3 are provided in the $NH_3$ gas supply line 631 from the upstream side. An Ar gas supply source 64 is connected to an upstream end portion of the Ar gas supply line 641, and a flow rate controller M4 and a valve V4 are provided in the Ar gas supply line 641 from the upstream side.

The aforementioned control unit 9 is connected to the plasma processing apparatus 2. The control unit 9 includes programs having commands (steps) for performing processes including plasma processing on the wafer W and a pre-coating process which will be described later.

Hereinafter, operations of a substrate processing method according to an embodiment will be described. First, as described above, the native oxide layer on the surface of the Si film of the wafer W is removed by the COR processing apparatus 90 and the annealing apparatus 91, and the Ti film is formed on the surface of the Si film of the wafer W by the plasma processing apparatus 2. However, the pre-coating process for previously forming the Ti film on the inner surface of the plasma processing apparatus 2 is performed in the plasma processing apparatus 2. The pre-coating process may be performed when the plasma processing apparatus 2 is first operated after it is installed or may be performed after the maintenance of the plasma processing apparatus 2 is completed.

The pre-coating process will be described with reference to the flowchart of FIG. 3. In the plasma processing apparatus 2, the processing chamber 20 is exhausted by the vacuum exhaust unit 24 so that a pressure in the processing chamber 20 is set to, e.g., 200 Pa without loading any wafer W therein. Then, $TiCl_4$ gas, Ar gas and $H_2$ gas are supplied into the processing chamber 20. A high frequency power is applied from the high frequency power supply 51. Accordingly, a plasma is generated in the processing chamber 20, and a Ti film is formed with a thickness of, e.g., 5 nm, on an inner surface of the processing chamber 20, a bottom surface of the gas shower head 5 and a surface of the mounting table 3 by reaction between $TiCl_4$ and $H_2$ (step S1).

Next, the supply of $TiCl_4$ gas and $H_2$ gas is stopped, and $NH_3$ gas and Ar gas are supplied into the processing chamber 20. Further, a high frequency power is applied from the high frequency power supply 51. Accordingly, $NH_3$ gas is activated, and the Ti film formed in the step S1 on the inner surface of the processing chamber 20, the bottom surface of the gas shower head 5 and the surface of the mounting table 3 is nitrided to a TiN film (step S2).

Upon completion of the nitriding of the Ti film in the step S2, the Ti film formation in the step S1 is performed again. Then, the nitriding of Ti film in the step S2 is performed again. In this manner, the Ti film formation in the step S1 and the nitriding of the Ti film in the step S2 are repeated n times (n being a natural number of 1 or above). As a consequence, a TiN film having a thickness of 200 nm or above, e.g., 550 nm, is formed.

The processing chamber 20, the gas shower head 5 and the mounting table 3 are made of, e.g., Ni, as described above. When forming the Ti film on a surface of Ni, Ni and Ti react with each other and to generate reaction products which stick to the surface of Ni. Therefore, the formed Ti film is quickly nitrided to a TiN film. In the step S2, the Ti film may be nitrided by supplying $NH_3$ gas into the processing chamber 20 without applying the high frequency power.

Then, the supply of $NH_3$ gas into the processing chamber 20 is stopped. $TiCl_4$ gas, Ar gas and $H_2$ gas are supplied and a high frequency power is applied from the high frequency power supply 51 (step S3). Accordingly, a Ti film is formed with a thickness of, e.g., 5 nm, on a surface of the TiN film formed on the inner surface of the processing chamber 20, the bottom surface of the gas shower head 5, and the surface of the mounting table 3.

Then, the supply of $TiCl_4$ gas and Ar gas is stopped, and the high frequency power is applied from the high frequency power supply 51 in a state where $H_2$ gas is supplied into the processing chamber 20. Accordingly, in the processing chamber 20, $H_2$ gas is activated and turned into a plasma (step S4). Since $TiCl_4$ gas is supplied during the Ti film formation in the steps S1 and step S3, chloride of Ti or a chlorine simple substance remains in an atmosphere in the processing chamber 20 or on the inner wall of the processing chamber 20. In this specification, chloride of Ti is generally indicated by $TiCl_x$, and a chlorine simple substance is generally indicated by $Cl_x$. The components containing $TiCl_x$ or $Cl_x$ remaining in the processing chamber 20 is reduced by the plasma of the $H_2$ gas and removed. In the step S4, Ar gas may be supplied together with $H_2$ gas.

After the reduction and removal of the components containing $TiCl_x$ or $Cl_x$ in the step S4, the Ti film formation in the step S3 is performed again. Then, the reduction and removal of the component containing $TiCl_x$ or $Cl_x$ in the step S4 is performed again. In this manner, the Ti film formation in the step S3 and the reduction and removal of the components containing $TiCl_x$ or $Cl_x$ in the step S4 are repeated m times (m being a natural number of 1 or above). As a consequence, a Ti film having a thickness of 300 nm or above, e.g., 850 nm, is formed.

Figure 3:
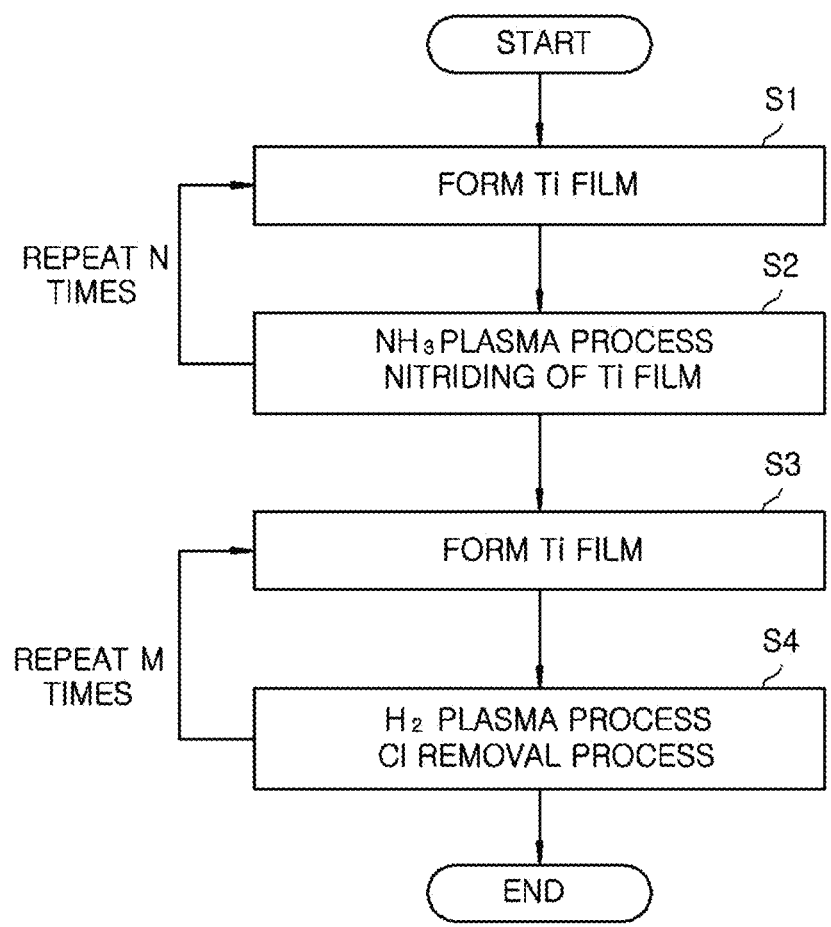
FIG. 3 is a flow chart showing steps of a pre-coating process in the plasma processing apparatus.

By performing the pre-coating process of the steps S1 to S4 shown in FIG. 3, the TiN film is formed with a thickness of, e.g., 550 nm, on a surface of a metal, e.g., Ni or the like, forming the processing chamber 20 and the Ti film is formed with a thickness of 850 nm on the surface of the TiN film in the processing chamber 20. The components containing $TiCl_x$ or $Cl_x$ are removed from the processing chamber 20. After the components containing $TiCl_x$ or $Cl_x$ are sufficiently removed, the supply of Ar gas and $H_2$ gas is stopped and the application of the high frequency power is stopped. Then, the pre-coating process is completed.

Hereinafter, the processing of the wafer W in the plasma processing apparatus 2 where the pre-coating process has been performed will be described with reference to FIG. 4. First, the wafer W from which the native oxide film is removed as described above is mounted on the mounting table 3 by a cooperative operation of the transfer arm 19 and the elevating pins 41 (step S11).

Thereafter, the gate valve 100 is closed and the processing chamber 20 is exhausted by the vacuum exhaust unit 24 so that a pressure in the processing chamber 20 can be set to, e.g., 133 Pa. Next, $TiCl_4$ gas, Ar gas and $H_2$ gas are supplied into the processing chamber 20 at flow rates of, e.g., 10 sccm, 1000 sccm and 10 sccm, respectively, and the high frequency power is applied from the high frequency power supply 51 (step S12). Accordingly, the $TiCl_4$ gas and the $H_2$ gas are activated and react with each other, and a Ti film is formed with a thickness of, e.g., 5 nm, on the surface of the wafer W.

Figure 5A:
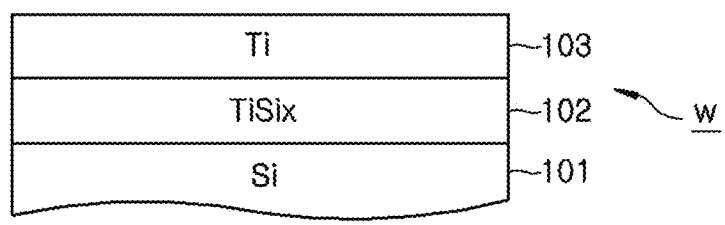
FIGS. 5A and 5B are cross sectional views showing a vicinity of a surface of the wafer after Ti film formation and TiN film formation.

As will be described later, an interface between the Ti film 103 and the Si film 101 as a base becomes a $TiSi_x$ film due to reaction therebetween during the film formation as shown in FIG. 5A. However, the entire Ti film 103 does not react with Si during the film formation to be $TiSi_x$, and the Ti film 103 is gradually changed to the $TiSi_x$ film 102 from a surface toward a deep portion. Therefore, it is difficult to simply measure a film thickness of the Ti film 103 and that of the $TiSi_x$ film 102 by X-ray fluorescent analysis (XRF), ellipsometry or the like. Accordingly, the thickness of the Ti film 103 formed on a $SiO_2$ film as a base film under the same conditions is used as the thickness of the Ti film 103 formed on the Si film 101 as a base film.

When the Ti film 103 is formed on the surface of the Si film 101, silicidation of Ti occurs on the interface between the Si film 101 and the Ti film 103 as shown in FIG. 5A. Therefore, the $TiSi_x$ film 102 is formed between the Si film 101 and the Ti film 103. In this specification, silicided Ti is generally indicated by $TiSi_x$. Next, the supply of $TiCl_4$ gas and $H_2$ gas and the application of the high frequency power are stopped and Ar gas is supplied into the processing chamber 20 (step S13). Accordingly, the $TiCl_4$ gas and the $H_2$ gas remaining in the processing chamber 20 are removed. As a result, the reaction between $TiCl_4$ and $H_2$ is stopped and the formation of the Ti film 103 is stopped.

Figure 6:
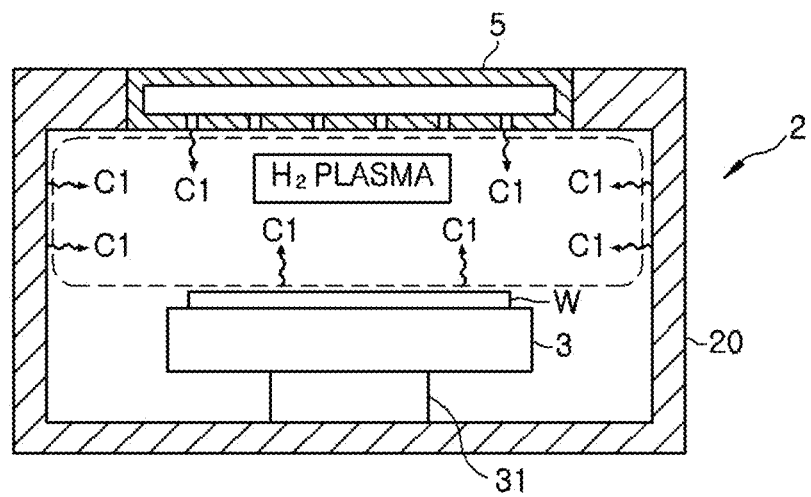
FIGS. 6 and 7 are views for explaining operations of the embodiment.

Next, in a state where the wafer W is provided in the processing chamber 20, the supply of Ar gas is stopped and a pressure in the processing chamber 20 is set to, e.g., 200 Pa. $H_2$ gas is supplied at a flow rate of, e.g., 4000 sccm, into the processing chamber 20, and a high frequency power of, e.g., 1350 W, is applied for 60 sec. In that state, a first reduction process is performed (step S14). Accordingly, $H_2$ gas is activated in the processing chamber as shown in FIG. 6. In the step S14, Ar gas may be supplied together with $H_2$ gas.

Figure 7:
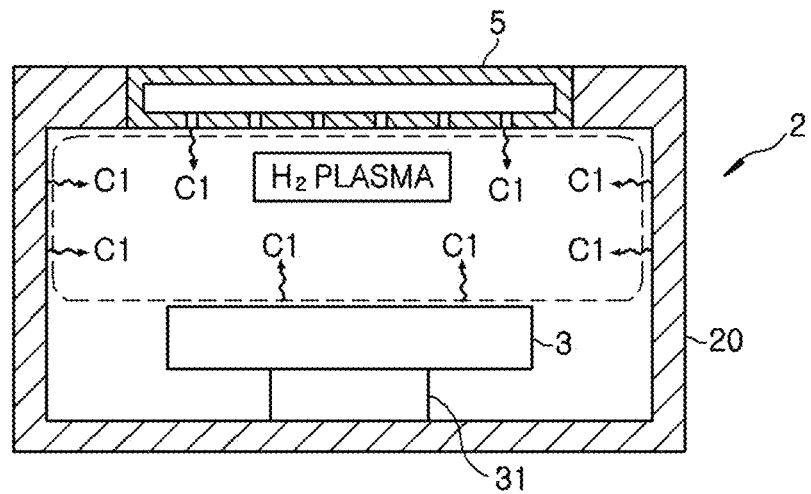

Since $TiCl_4$ gas and $H_2$ gas are supplied in the step S12, components containing $TiCl_x$ or $Cl_x$ remain in the processing chamber 20 or on the surface of the wafer W. When the $H_2$ gas is activated in the step S14, the components containing $TiCl_x$ or $Cl_x$ are reduced by the plasma obtained by activating $H_2$ gas and removed. In FIGS. 6 and 7 to be described later, the illustration of the plasma processing apparatus 2 is simplified.

The supply of $H_2$ gas and the application of the high frequency power are stopped. The gate valve 100 is opened and the wafer W is unloaded from the plasma processing apparatus 2 by the transfer arm 19 (step S15). Next, the gate valve 100 is closed and the processing chamber 20 is sealed. Then, a second reduction process is performed in a state where no wafer W is provided in the processing chamber 20 for, e.g., 60 sec, as shown in FIG. 7 (step S16). The second reduction process is performed by setting a pressure in the processing chamber 20 to, e.g., 200 Pa, supplying $H_2$ gas at a flow rate of, e.g., 4000 sccm, into the processing chamber 20, applying a high frequency power of, e.g., 1350 W, and exciting a plasma of the $H_2$ gas in the processing chamber 20. Therefore, the components containing $TiCl_x$ or $Cl_x$ remaining in the processing chamber 20 without having been completely removed by the first reduction process can be completely reduced and removed by the second reduction process. In the step S16, Ar gas may be supplied together with $H_2$ gas.

Accordingly, when a next wafer W is loaded and the Ti film 103 is formed in the plasma processing apparatus 2, it is possible to prevent $TiCl_x$ or $Cl_x$ from remaining in the processing chamber 20.

The wafer W unloaded from the plasma processing apparatus 2 is loaded into the thermal ALD apparatus 92 by the transfer arm 19. In the thermal ALD apparatus 92, $TiCl_4$ gas and $NH_3$ gas are alternately supplied at a predetermined interval while supplying $N_2$ gas into the processing chamber 20. Accordingly, a TiN film 104 is deposited on the top surface of the Ti film 103 as shown in FIG. 5B.

Figure 5B:
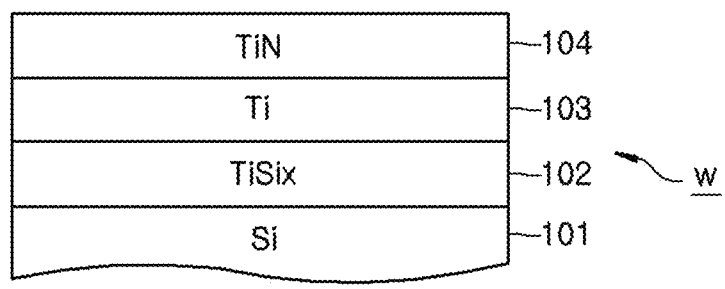

The wafer W having the TiN film 104 formed on the top surface of the Ti film 103 as shown in FIG. 5B is transferred to the load-lock chamber 13 in a vacuum atmosphere by the transfer arm 19. Then, an atmosphere of the load-lock chamber 13 is switched to an atmospheric atmosphere, and the wafer W is returned to, e.g., the original transfer carrier C, by the transfer arm 65. In a subsequence step, a tungsten (W) film forming, e.g., an electrode, is formed on the top surface of the wafer W having the TiN film 104.

As described above, in the above embodiment, in the plasma processing apparatus 2, the Ti film 103 is formed on the wafer W having on a surface thereof the Si film 101. When Cl atoms are taken into the Ti film 103 during the formation of the Ti film 103 on the surface of the Si film 101, the Cl atoms taken into the film react with hydrogen atoms, thereby generating HCl. HCl thus generated inflicts damages on the surface of the Ti film 103. Therefore, after the $TiCl_4$ gas is supplied, it is required to remove the components containing $TiCl_x$ or $Cl_x$ remaining in the processing chamber 20.

When the components containing $TiCl_x$ or $Cl_x$ are removed, reaction by-products such as $NH_4Cl$ and the like may be removed by using, e.g., $NH_3$ gas, as described in "Background of the Invention". However, in the case of using $NH_3$ gas, N atoms remaining in the processing chamber 20 are taken into the Ti film 103 formed on the wafer W and Ti silicidation reaction is inhibited. Thus, as the Ti film 103 becomes thinner, adverse effects on the electrical characteristics become apparent.

In the above-described embodiment, after the Ti film 103 is formed on the surface of the Si film 101 of the wafer W in the plasma processing apparatus 2, the components containing $TiCl_x$ or $Cl_x$ in the processing chamber 20 are removed by using a plasma obtained by activating $H_2$ gas (hydrogen plasma). Therefore, it is possible to prevent N atoms from remaining in the processing chamber 20 and being taken into the Ti film 103 formed on the wafer W. Accordingly, the Ti silicidation reaction on the interface between the Ti film 103 and the Si film 101 is not inhibited, and the TiSi$_x$ film 102 is formed with a uniform thickness.

If the plasma processing is performed for a long period of time in a state where the wafer W is provided in the processing chamber 20, the wafer W may be damaged. Therefore, it is preferable to divide the reduction process using a hydrogen plasma into the first reduction process performed in a state where the wafer W is loaded and the second reduction process performed in a state where the wafer W is unloaded.

In the second reduction process, the components containing TiCl$_x$ or Cl$_x$ are removed by the hydrogen plasma without using NH$_3$ gas. Thus, N atoms can be prevented from remaining in the processing chamber 20. Accordingly, when a next wafer W is loaded into the plasma processing apparatus 2 and the Ti film 103 is formed on the wafer W, N atoms can be prevented from being taken into the Ti film 103.

When only the first reduction process using a hydrogen plasma is performed in a state where the wafer W is loaded, N atoms can be prevented from being taken into the Ti film 103 formed on the wafer W, which is effective. When only the second reduction process using a hydrogen plasma is performed in a state where the wafer W is unloaded, it is possible to prevent N atoms from remaining in the processing chamber 20. Therefore, N atoms can be prevented from being taken into a Ti film 103 formed on a next wafer W, which is effective.

In the second reduction process, no wafer W is provided in the processing chamber 20. Therefore, the second reduction process may be performed for a period of time, e.g., 90 sec, which is longer than that of the first reduction process. For example, in the first reduction process, the flow rate of H$_2$ gas is decreased and the intensity of the plasma is decreased. On the other hand, in the second reduction process, the flow rate of H$_2$ gas is increased and the intensity of the plasma is increased.

When the pre-coating process is performed on the inner surface of the processing chamber 20 of the plasma processing apparatus 2, the TiN film is formed on the inner surface of the processing chamber 20 and, then, the Ti film is formed on the surface of the TiN film. As described above, when the Ti film is formed on a surface of a metal, e.g., Ni or the like, reaction products between Ni and Ti are stuck and it is difficult to remove the reaction products. Therefore, the Ti film formed on the surface of Ni is nitrided to a TiN film. The TiN film is sputtered by the plasma during the processing and N atoms are separated. Accordingly, N atoms may be taken into the Ti film 103 formed on the wafer W.

Therefore, the Ti film is formed on the surface of the TiN film formed on the surface of Ni, and the reduction process is performed by using a hydrogen plasma.

Accordingly, a stable Ti film from which Cl is removed is formed on the surface of the pre-coating film. As a consequence, the separation of N from the pre-coating film during the processing can be suppressed, and the peeling off of the Ti film does not occur.

If the thickness of the Ti film 103 formed on the wafer W is reduced, it is easy for N on the surface of the Ti film 103 to reach the interface between the Si film 101 and the Ti film 103 and, thus, silicidation is inhibited. Therefore, it is preferable that the thickness of the Ti film 103 deposited on the surface of the Si film 101 in the step S12 (the thickness of the Ti film 103 formed on the SiO$_2$ film as a base) is, e.g., 10 nm or less.

The present disclosure may be applied to a substrate processing method for forming a Ti film 103 by using a gas such as TiF$_4$ or the like, instead of TiCl$_4$ gas. For example, the present disclosure may be applied to a substrate processing method for forming a tantalum (Ta) film by plasma CVD.

Further, there may be employed an ALD method for forming a Ti film 103 by alternately and intermittently supplying a raw material gas, e.g., TiCl$_4$ gas, and a reactant gas, e.g., a plasma of H$_2$ gas.

TEST EXAMPLES

In order to examine the effect of the present disclosure, samples of test examples 1 and 2 and a comparative example were manufactured and the following tests were performed.

Test Example 1

In a test example 1, a wafer W was processed in the manner described in the above embodiment.

Test Example 2

Figure 8A:
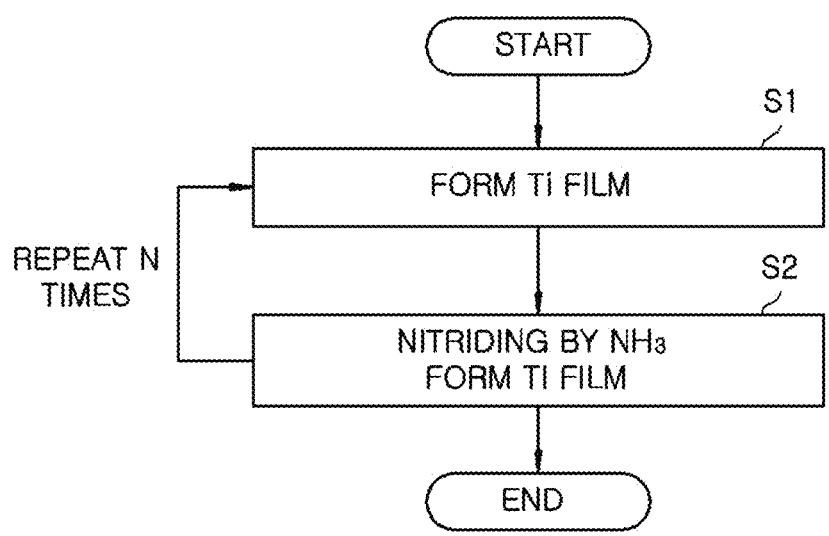
FIGS. 8A and 8B are flow charts showing a film forming process in a comparative example.

In a test example 2, the wafer W was processed in the same manner as that in the test example 1 by the plasma processing apparatus 2 in which the pre-coating process was performed by nitriding the Ti film by using NH$_3$ gas as in the step S2 shown in FIG. 3 without performing the steps S3 and S4 as shown in FIG. 8A. In the test example 2, the steps S1 and S2 were repeated, e.g., n times, and the TiN film was formed with a thickness of 850 nm.

Comparative Example

Figure 4:
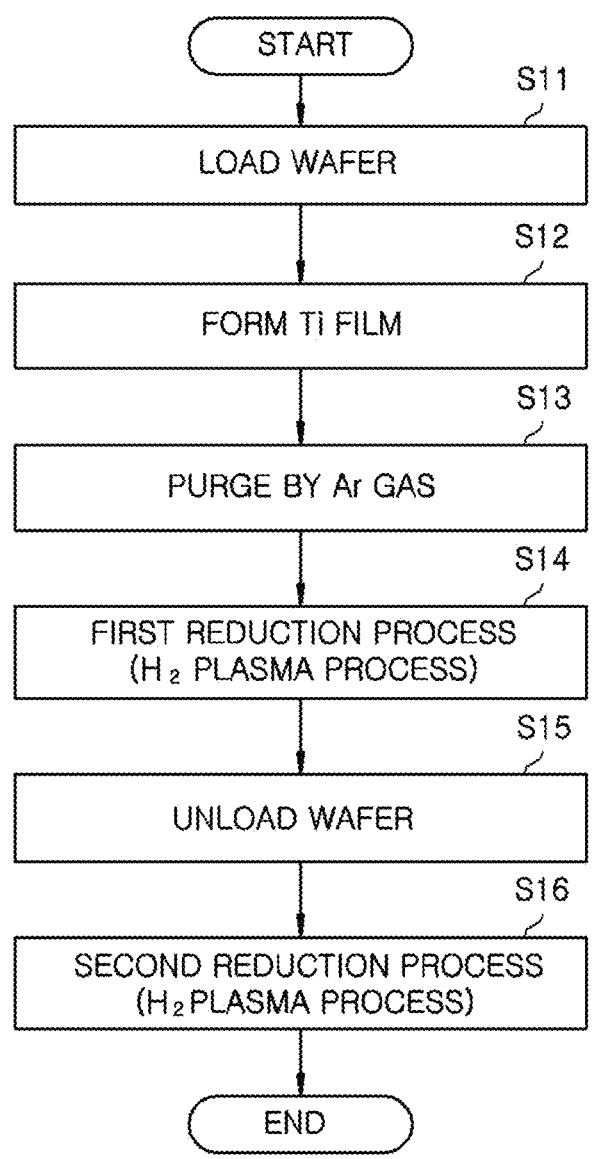
FIG. 4 is a flow chart showing steps of a Ti film forming process in the plasma processing apparatus.
Figure 8B:
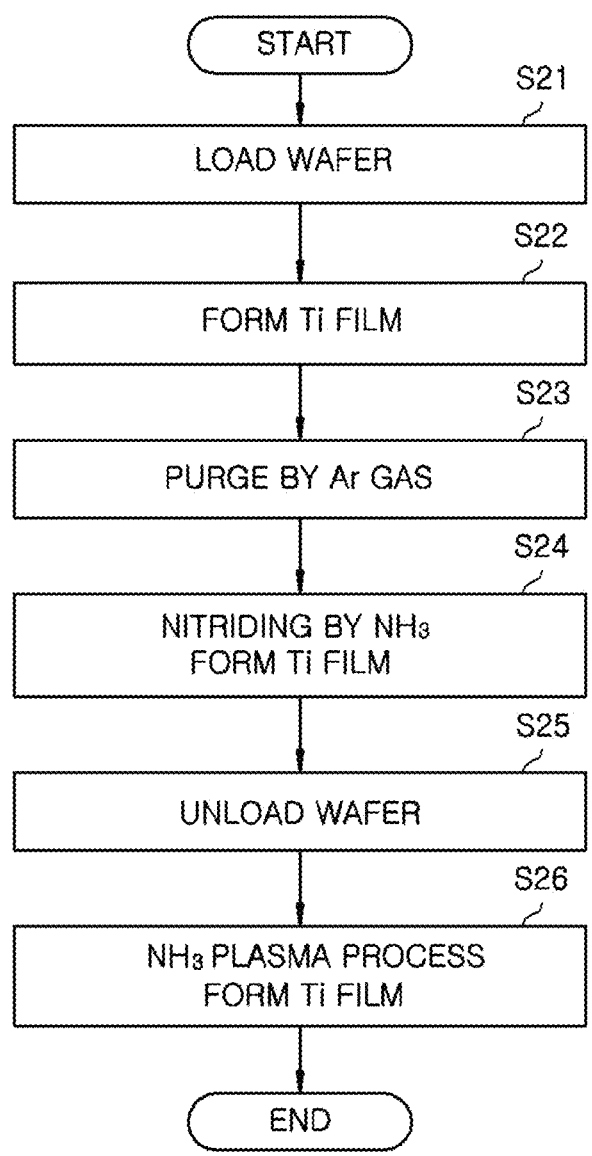

A TiN film was formed by performing the first reduction process in the step S14 by using NH$_3$ gas and the second reduction process in the step S16 by using NH$_3$ gas in the processing of the wafer W shown in FIG. 4. In the comparative example, only a TiN film was formed as a pre-coating film with a thickness of 550 nm. The steps S1 and S2 in FIG. 8A and the steps S21 to S26 in FIG. 8B correspond to groups of steps in the pre-coating process and the wafer processing in the comparative example, respectively.

Figure 9:
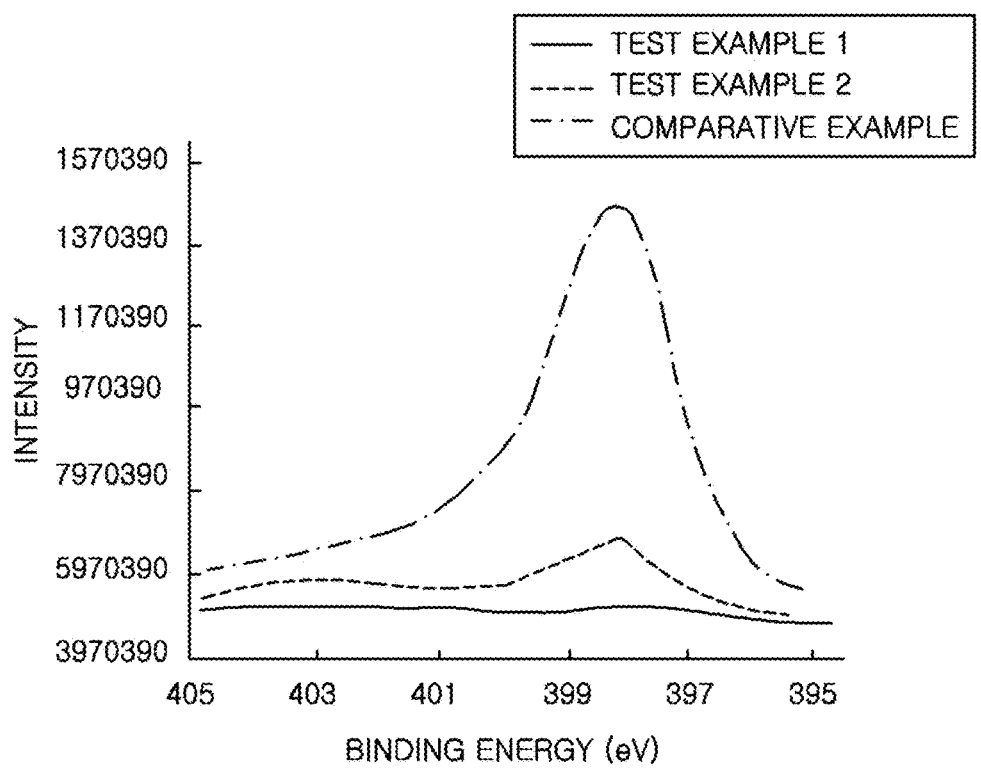
FIG. 9 is a characteristic view showing concentration of N atoms contained in a Ti film in test examples 1 and 2 and a comparative example.

The concentration of N atoms in the wafers W processed in the test examples 1 and 2 and the comparative example was measured by using X-ray photoelectron spectroscopy. FIG. 9 is a characteristic view showing a result thereof. In FIG. 9, the horizontal axis represents binding energy of photoelectron of the irradiated X-rays, and the vertical axis represents a monitored intensity of photoelectron. A peak at the binding energy of 398 eV indicates N atoms.

As shown in FIG. 9, in the comparative example, a large amount of N atoms were detected. The concentration of N atoms in the Ti film 103 was about 50.1 atom %. On the other hand, in the test example 1, the concentration of N atoms was about 1.3 atom %. In the test example 2, the concentration of N atoms was about 10.6 atom %.

Figure 10:
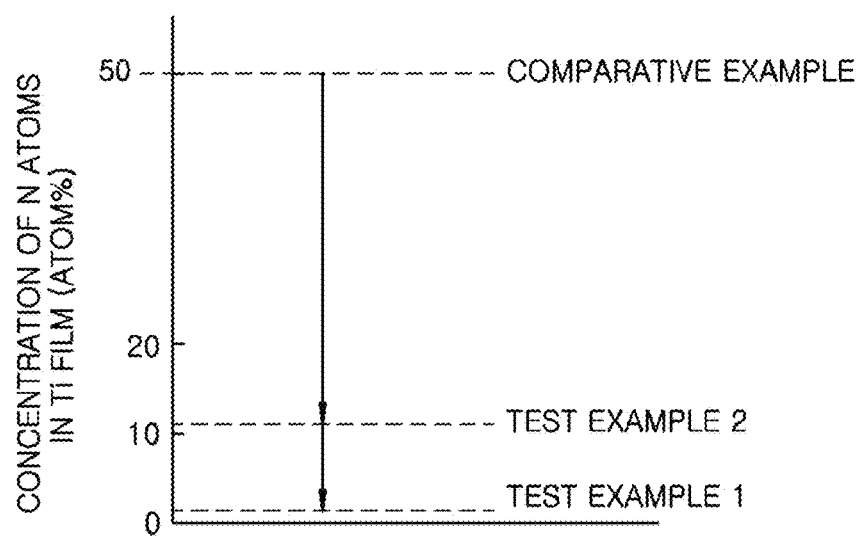
FIG. 10 is a graph for explaining reduction of the concentration of the N atoms contained in the Ti film.

FIG. 10 schematically illustrates the result shown in FIG. 9. As can be seen from FIG. 10, in the comparative example, the concentration of N atoms in the Ti film 103 was about 50 atom %. The concentration of N atoms in the Ti film 103 formed on the wafer W can be reduced to about 10 atom % by performing the first reduction process and the second reduction process by using a hydrogen plasma as in the test example 1 except the pre-coating process. The concentration of N atoms in the Ti film 103 formed on the wafer W can be reduced to 2 atom % or less by coating the Ti film on the surface of the TiN film and performing hydrogen plasma processing, instead of by pre-coating only a TiN film in the processing chamber 20.

According to the above result, the concentration of N atoms in the Ti film 103 can be reduced by using a hydrogen plasma in the first reduction process performed when the wafer W is loaded into the processing chamber 20 and in the second reduction process performed during the exchange of the wafers W. The concentration of N atoms in the Ti film 103 formed on the wafer W can be further reduced by pre-coating the Ti film on the surface of the TiN film in the processing chamber 20.

Figure 11:
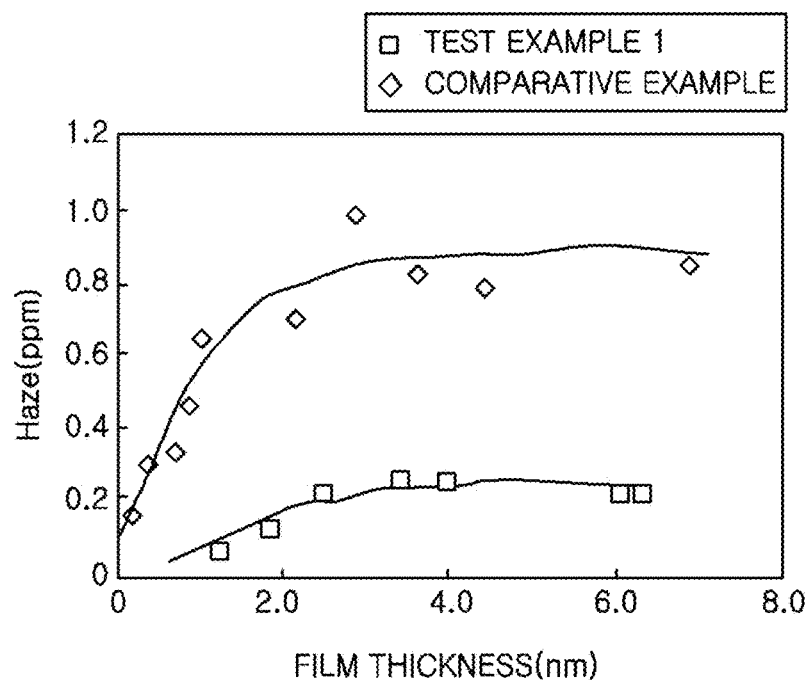
FIG. 11 is a characteristic view showing a thickness of the Ti film and a surface roughness of the Ti film.

The film thickness and the surface roughness of the Ti films 103 of the samples of the test examples 1 and 2 and the comparative example were measured. The film thickness of the Ti films 103 is indicated by measuring an amount of Ti atoms in each sample by X-ray fluorescent analysis and converting to a thickness of a Ti film having a density of Ti atoms corresponding to the measured Ti atoms in the case of forming the Ti film 103 using PVD (Physical Vapor Deposition). The surfaces of the samples were measured by a particle measuring device, and calculated haze level values were set to the surface roughness. The result thereof is shown in FIG. 11. FIG. 11 is a characteristic view showing a surface roughness and a PVD equivalent film thickness in the samples of the test example 1 and the comparative example. As shown in FIG. 11, the value of the surface roughness with respect to the film thickness of the Ti film 103 of the wafer W was smaller in the sample of the test example 1 than in the sample of the comparative example.

Figure 12:
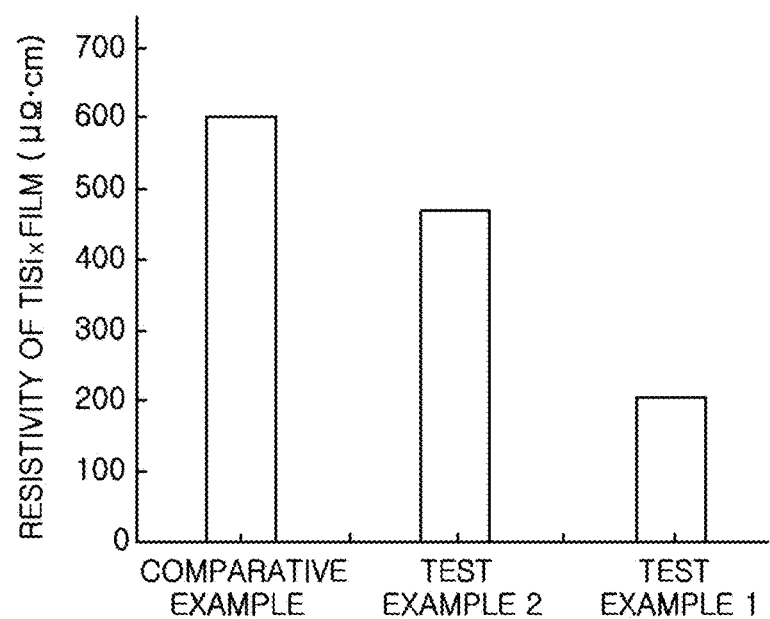
FIG. 12 is a characteristic view showing resistivity of a $TiSi_x$ film in the test examples 1 and 2 and the comparative example.

In the samples of the test examples 1 and 2 and the comparative example, after the Ti film 103 was formed, a cap of TiN for preventing oxidation was formed in situ on the Ti film 103. Next, the samples of the test examples 1 and 2 and the comparative example were annealed under a vacuum atmosphere. The TiSi$_x$ film 102 was formed by promoting silicide reaction and, then, a sheet resistance of the TiSi$_x$ film 102 was measured and compared with a resistivity. The resistivity of the TiSi$_x$ film 102 was calculated by subtracting, from a sheet resistance of the sample, a resistance of the TiN film 104 portion that is obtained by measuring a sheet resistance of the single TiN film 104 and converting it to the resistance of the TiN film 104 portion in the sheet resistance of the sample. The result thereof is shown in FIG. 12. FIG. 12 is a characteristic view showing the resistivity of the TiSi$_x$ film 102 in the test examples 1 and 2 and the comparative example.

As a result, the resistivity of the TiSi$_x$ film 102 of the test example 1 was 207 μΩ·cm, and that of the TiSi$_x$ film 102 of the test example 2 was 472 μΩ·cm. The resistivity of the TiSi$_x$ film 102 in the comparative example was 620 μΩ·cm. The resistivity of the TiSi$_x$ film 102 in the test examples 1 and 2 was considerably smaller than that in the comparative example. Especially, the resistivity of the TiSi$_x$ film 102 in the test example 1 was ⅓ of that in the comparative example.

Figure 13A:
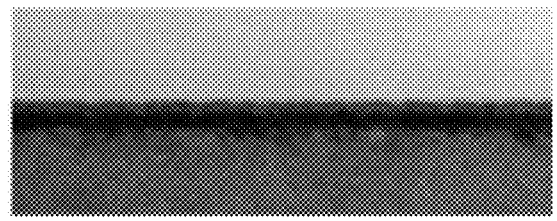
FIGS. 13A to 13C show images of cross sections of the wafer surface in the test examples 1 and 2 and the comparative example, respectively.
Figure 13B:
Figure 13C:
Figure 14:
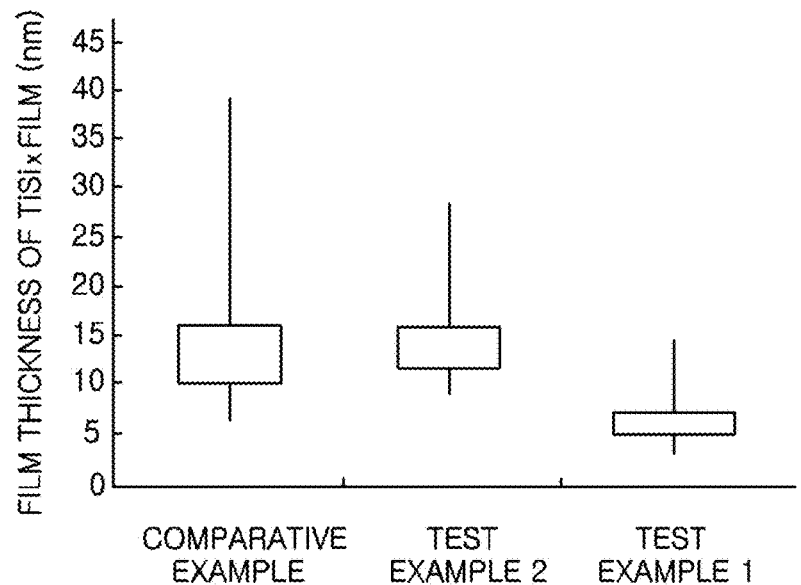
FIG. 14 is a characteristic view showing a film thickness of $TiSi_x$ film in the test examples 1 and 2 and the comparative example.

Images of cross sections of the samples of which sheet resistances were measured in the test examples 1 and 2 and the comparative example were captured by a transmission type electron microscope. The results thereof are shown in FIGS. 13A to 13C. The thickness of the TiSi$_x$ film 102 was measured at five locations in the respective images and an average value thereof was obtained. The result thereof is shown in FIG. 14. FIG. 14 is a characteristic view showing film thicknesses of the TiSi$_x$ films 102 of the samples in the test examples 1 and 2 and the comparative example. In boxplots of FIG. 14, upper and lower ends of whiskers indicate a maximum value and a minimum value, respectively. Further, top sides and bottom sides of the boxes indicate a third quartile and a first quartile, respectively, from the median.

As can be seen from FIG. 14, in the test example 1, an average film thickness of the TiSi$_x$ film 102 was 7.2 nm. In the comparative example, the TiSi$_x$ film 102 was not definitely formed, and an average film thickness of the TiSi$_x$ film 102 was 15.8 nm. The surface roughness of the wafer W and the variation of the thickness of the TiSi$_x$ film 102 were greater in the comparative example than in the test example 1. The surface roughness of the TiSi$_x$ film 102 was also greater in the comparative example than in the test example 1.

In the test example 2, the average film thickness of the TiSi$_x$ film 102 was 14.3 nm. In the comparative example, the average film thickness of the TiSi$_x$ film 102 was 15.8 nm. This indicates that the improvement is seen in the test example compared to the comparative example.

Since the film thickness of the TiSi$_x$ film 102 in the sample of the comparative example is not uniform compared to that in the samples of the test examples 1 and 2, the surface roughness is great as shown in FIG. 13C. On the other hand, in the test example 1, the film thickness of the TiSi$_x$ film 102 is uniform and, thus, the surface roughness is small.

Figure 15:
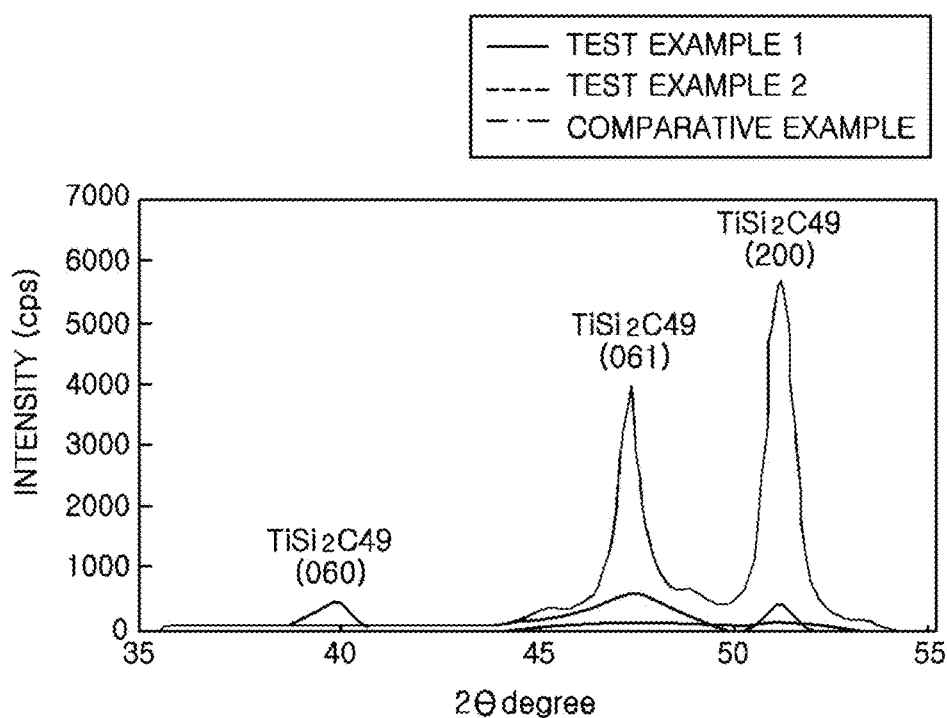
FIG. 15 is a characteristic view showing a result of X-ray crystal structure analysis in the test examples 1 and 2 and the comparative example.

The crystallinity of the TiSi$_x$ film 102 was examined by X-ray crystal structure analysis. The result thereof is shown in FIG. 15. FIG. 15 shows the result of the X-ray crystal structure analysis in the test examples 1 and 2 and the comparative example. As can be seen from FIG. 15, in the test example 1, peaks indicating crystal of C49 phase TiSi$_2$(061) and crystal of C49 phase TiSi$_2$(200) are clearly seen. In the test example 2, peaks indicating crystal of C49 phase TiSi$_2$(061) and crystal of C49 phase TiSi$_2$(200) in the test example 2 are seen. However, in the comparative example, a peak indicating crystal of C49 phase TiSi$_2$(060) is slightly seen and a peak indicating crystal of C49 phase TiSi$_2$(200) is hardly seen. From the above, it is clear that the silicidation was promoted in the test examples 1 and 2 than in the comparative example, so that the crystallization of the TiSi$_x$ film 102 proceeded.

In the present disclosure, it is possible to prevent N atoms from being taken into the Ti film 103 and, thus, the inhibition of Ti silicidation on the interface between the Ti film 103 and the Si film 101 can be suppressed. As a result, the TiSi$_x$ film 102 having a uniform thickness and a low resistance can be formed.

While the disclosure has been shown and described with respect to the embodiments, it will be understood by those skilled in the art that various changes and modifications may be made without departing from the scope of the disclosure as defined in the following claims.

What is claimed is:

1. A substrate processing method for forming a metal film on a target substrate by using a plasma, the method comprising:
    loading the target substrate having a silicon-containing layer on a surface thereof into a processing chamber, wherein the processing chamber is pre-coated with a film containing a metal;

forming the metal film on the target substrate by introducing hydrogen gas and a gaseous compound of the metal and halogen into the processing chamber and generating a plasma;

reducing halogen containing components remaining after the formation of the metal film in the processing chamber and on the surface of the target substrate by performing a first reduction process, wherein the first reduction process comprises forming an atmosphere of a plasma obtained by exciting hydrogen gas in the processing chamber;

unloading the target substrate from the processing chamber;

after the target substrate is unloaded from the processing chamber, reducing halogen containing components remaining after the first reduction process in the processing chamber by performing a second reduction process, wherein the second reduction process comprises forming an atmosphere of a plasma obtained by exciting hydrogen gas in the processing chamber; and loading a next target substrate into the processing chamber, wherein the method further comprises, before said loading the target substrate, performing a pre-coating process, the pre-coating process comprising:

pre-coating the metal film on an inner surface of the processing chamber by generating a plasma while introducing the gaseous compound and the hydrogen gas; and reducing halogen containing components remaining after the pre-coating of the metal film on the inner surface of the processing chamber by forming an atmosphere of a plasma obtained by exciting hydrogen gas in the processing chamber.

2. The substrate processing method of claim 1, wherein said forming the metal film is performed by plasma chemical vapor deposition.

3. The substrate processing method of claim 2, wherein the metal film is a titanium film and the gaseous compound is titanium tetrachloride.

4. The substrate processing method of claim 2, wherein the metal film is a titanium film,
the pre-coating process further comprising: before said pre-coating the titanium film on the inner surface of the processing chamber, ore-coating a titanium nitride film on the inner surface of the processing chamber.

5. The substrate processing method of claim 1, wherein the metal film is a titanium film and the gaseous compound is titanium tetrachloride.

6. The substrate processing method of claim 1, wherein the metal film is a titanium film, the pre-coating process further comprising: before said ore-coating the titanium film on the inner surface of the processing chamber, pre-coating a titanium nitride film on the inner surface of the processing chamber.

7. The substrate processing method of claim 1, wherein a period during which the second reduction process is performed is longer than a period during which the first reduction process is performed.

8. A non-transitory storage medium storing a computer program used for an apparatus for forming a metal film on a target substrate by using a plasma in a processing chamber, wherein the computer program, when executed by a processor, causes the apparatus to perform a substrate processing method, wherein the method comprises:

loading the target substrate having a silicon-containing layer on a surface thereof into the processing chamber which is pre-coated with a film containing a metal;

forming the metal film on the target substrate by introducing hydrogen gas and a gaseous compound of the metal and halogen into the processing chamber and generating a plasma;

reducing halogen containing components remaining after the forming the metal film in the processing chamber and on the surface of the target substrate by performing a first reduction process wherein the first reduction process comprises forming an atmosphere of a plasma obtained by exciting hydrogen gas in the processing chamber;

unloading the target substrate from the processing chamber;

after the target substrate is unloaded from the processing chamber, reducing halogen containing components remaining after the first reduction process in the processing chamber by performing a second reduction process, wherein the second reduction process comprises forming an atmosphere of a plasma obtained by exciting hydrogen gas in the processing chamber; and loading a next target substrate into the processing chamber, wherein the method further comprises, before said loading the target substrate, performing a pre-coating process, the pre-coating process comprising:

pre-coating the metal film on an inner surface of the processing chamber by generating a plasma while introducing the gaseous compound and the hydrogen gas; and reducing halogen containing components remaining after the pre-coating of the metal film on the inner surface of the processing chamber by forming an atmosphere of a plasma obtained by exciting hydrogen gas in the processing chamber.

* * * * *